US006333882B1

(12) United States Patent
Merritt et al.

(10) Patent No.: US 6,333,882 B1
(45) Date of Patent: Dec. 25, 2001

(54) EQUILIBRATION/PRE-CHARGE CIRCUIT FOR A MEMORY DEVICE

(75) Inventors: Todd A. Merritt; George B. Raad, both of Boise; Charles L. Ingalls, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/645,577

(22) Filed: Aug. 25, 2000

(51) Int. Cl.$^7$ .................................................. G11C 7/00
(52) U.S. Cl. .............................................. 365/203; 365/200
(58) Field of Search ...................................... 365/203, 200

(56) References Cited

U.S. PATENT DOCUMENTS

| | | |
|---|---|---|
| 5,235,550 | 8/1993 | Zagar . |
| 5,615,158 | 3/1997 | Ochoa et al. . |
| 5,862,089 | 1/1999 | Raad et al. . |
| 5,903,502 | 5/1999 | Porter . |
| 5,923,603 | 7/1999 | Pinney . |
| 6,154,401 * | 11/2000 | Casper et al. .......................... 365/202 |
| 6,205,066 * | 3/2001 | Shirley .................................. 365/200 |

* cited by examiner

Primary Examiner—Richard Elms
Assistant Examiner—VanTha Nguyen
(74) Attorney, Agent, or Firm—Dickstein Shapiro Morin & Oshinsky LLP

(57) ABSTRACT

An equilibration circuit for a memory device that prevents excessive current from being drawn by the memory device when a row to column short exists while still allowing the use of segmented column repair is disclosed. Each equilibration circuit of a memory device is connected to the equilibration voltage through a transistor that is controlled by a pulsed signal. When the pulsed signal is high, the transistor will turn on, connecting the digital lines to the equilibration voltage to pre-charge the digit lines to the equilibration voltage. The pulse duration is short enough, however, to turn the transistor off before the equilibration voltage can be pulled down if a column to row short exists.

55 Claims, 6 Drawing Sheets

EQUILIBRATION/PRE-CHARGE CIRCUIT FOR A MEMORY DEVICE

BACKGROUND OF THE INVENTION

1. Field of the Invention

The present invention relates generally to semiconductor memory devices and, more particularly, to an equilibrate and pre-charge circuit having a pulsed signal that controls connection of the equilibration circuit to an equilibration voltage.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a terminal of the capacitor and the gate terminal of the transistor is connected to a wordline of the memory device. The transistor thus acts as a gate between the digit line and the capacitor.

The second terminal of the capacitor is connected to a voltage rail which carries a voltage, such as VCC/2. Thus, when the wordline for a particular cell is active, the gate transistor is in a conducting state and the capacitor is connected to the digit line. The capacitor stores a charge that, depending on whether the polarity of the voltage across the capacitor is positive or negative, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one or a binary zero.

Memory devices are typically constructed with complementary digit lines of equal capacitance. Sense amplifiers are connected between the digit lines and operate to sense the differential voltage across the digit lines. Before a memory cell is selected for access, the complementary digit lines must be equilibrated. Equilibration circuits typically short the complementary digit lines together, resulting in an equilibrate voltage equal to the voltage midpoint between the two equal capacitance and logically opposite digit lines. Conventionally, a DRAM contains one sense amplifier for a designated group (row or column) of memory cells. If the voltage level stored in the memory cell represents a binary zero, one of the digit lines will increase in level and the other digit line will decrease in level. If the voltage level stored in the selected memory cell corresponds to a binary one, a change in the opposite direction occurs. Through this complementary operation, the sense amplifier yields a single output signal which is coupled through an output buffer to an output pin of the DRAM device.

FIG. 1 illustrates a sense amplifier 30 and related circuitry of a DRAM device having a first array ARRAY0 20 and a second array ARRAY1 22, each of which contains a plurality of memory cells 21 (illustrated in ARRAY0 20). While only one memory cell 21 is depicted, it should be understood that each array ARRAY0 20 and ARRAY1 22 contains a plurality of such cells. A sense amplifier 30 senses the voltage level in the selected memory cell of the selected array 20, 22 via the pair of digit lines D0 24 and D0* 26. One of the arrays 20, 22 is selected by the application of signals ISOa and ISOb to transistors 32a, 32b and 34a, 34b, respectively. Thus, when ISOa is driven to a logic high value and ISOb is driven to a logic low value, transistors 32a and 32b become conductive, i.e., turn on, to connect ARRAY0 20 to sense amplifier 30 while transistors 34a and 34b do not conduct, i.e., remain off, to isolate ARRAY1 22 from sense amplifier 30. When ISOa is driven to a logic low value and ISOb is driven to a logic high value, transistors 34a and 34b turn on to connect ARRAY1 22 to sense amplifier 30 while transistors 32a and 32b remain off to isolate ARRAY0 20 from sense amplifier 30.

Equilibration circuits 50a and 50b are provided to pre-charge the digit lines. Equilibration circuit 50a includes transistor 54 with a first source/drain region coupled to digit line D0 24, a second source/drain region coupled to digit line D0* 26 and a gate coupled to receive an equilibration signal labeled EQa. Equilibration circuit 50a further includes transistors 56, 58 and 60. Transistor 56 includes a first source/drain region that is coupled to digit line D0 24, a gate that is coupled to receive the equilibration signal EQa, and a second source/drain region that is coupled to a first source/drain region of transistor 60. Transistor 58 includes a first source/drain region that is coupled to digit line D0* 26, a gate that is coupled to receive the equilibration signal EQa, and a second source/drain region that is coupled to the first source/drain region of transistor 60. Transistor 60 has a second source/drain region that is coupled to an equilibration voltage, typically Vcc/2, and a gate that is connected to a pumped Vcc voltage, Vccp, which is typically about one to two volts higher than Vcc. The application of Vccp to the gate of transistor 60 maintains transistor 60 in a constant conducting state. When the EQa signal is at a high logic level, equilibration circuit 50a effectively shorts digit line D0 24 to digit line D0* 26 such that both lines are equilibrated to the voltage Vcc/2. Equilibration circuit 50b is constructed in a similar manner to equilibration circuit 50a and operates when the EQb signal is at a high logic level.

When sense amplifier 30 has sensed the differential voltage across the digit lines D0 24 and D0* 26, a signal representing the charge stored in the accessed memory cell is output from the DRAM device on the input/output (I/O) lines I/O 36 and I/O* 38 by connecting the I/O lines I/O 36 and /O* 38 to the digit lines D0 24 and D0* 26, respectively. A column select (CSEL) signal from column select signal line 62 is applied to transistors 40,42 to turn them on and connect the digit lines D0 24 and D0* 26 to the I/O lines I/O 36 and I/O* 38.

There are problems, however, with the conventional equilibration circuits 50a, 50b of FIG. 1, especially when a column to row short circuit, such as for example the conductor 70 between wordline 23 and digit line D0 24 illustrated in FIG. 2, occurs. Such short circuits may be formed during processing of the semiconductor device. During standby operation, i.e., when memory cell 21 is not being accessed, the word line WL 23 is maintained at ground and the signal EQa is high, thus turning on transistors 54, 56 and 58. When a short 70 does occur, a conductive path is created between ground (from wordline WL 23) and Vcc/2 through transistors 56 and 60. Typically, transistor 60 is sized to limit the amount of current that will pass through it when a short 70 exists. For example, the current is typically limited to approximately 40 µA. As the densities of memory circuits increase, however, the number of such row to column short circuits also increases. Thus, the total current drawn from Vcc/2 to ground by multiple shorts may be sufficient to cause a decrease in the voltage Vcc/2. A decrease in the voltage Vcc/2 will adversely affect the operation of the memory device, as the digit lines D0 24 and D0* 26 will not be properly pre-charged to the full Vcc/2 level. Additionally, a column to row short increases the power consumption by the memory device, and also increases the accompanying heat dissipation, both of which can adversely affect the operation of the memory device and system in which it is installed.

There have been several methods proposed to prevent such a drop in the level of Vcc/2 caused by row to column shorts. For example, as illustrated in FIG. 3, a global Vcc/2 supply line 74 with a fuse 72, parallel to the column select line CSEL, has been proposed. Thus, if a column to row short circuit, such as short 70, exists in ARRAY0 20, fuse 72 could be blown, thus removing the supply voltage Vcc/2 from equalization circuits 50a, 50b and preventing the short circuit 70 from causing a decrease in the voltage Vcc/2. There are problems with this approach, however, as the opening of fuse 72 disables all segments in a column, i.e., ARRAY0 20 and ARRAY1 22, even though the short 70 is only in one segment, i.e., ARRAY0 20. Many memory devices utilize segmented redundant memory columns to replace a defective memory cell identified during testing of the memory device. By segmenting the redundant columns, a defective memory cell in a region of the primary memory array can be repaired with only a portion of the redundant column. For example, only a portion of the redundant segment would be used to replace the defective segment from ARRAY0 20. Thus, for memory devices which utilize segmented column repair to replace defective memory cells, the blowing of fuse 72 in a column will disable every segment in that column, requiring an entire redundant column for repair, instead of just a column segment to replace the defective memory cell. Thus, those segments which do not have a defect would still be replaced by a redundant segment. The columns of redundant memory cells necessarily occupy space on the die. Therefore, it is desirable to obtain the maximum number of repairs using a minimum number of spare columns. The use of a global Vcc/2 supply line with a fuse 72 as illustrated in FIG. 3 does not allow the maximizing of the redundant columns for segmented repair.

Thus, there exists a need for an equilibration circuit in a memory device that limits excessive current from being drawn by the memory device, and the resulting drop in the equilibration voltage, if a row to column short exists while still allowing the use of segmented column repair to maximize die area.

SUMMARY OF THE INVENTION

The present invention overcomes the problems associated with the prior art and provides an equilibration circuit for a memory device that limits excessive current from being drawn by the memory device when a row to column short exists while still allowing the use of segmented column repair to maximize die area.

In accordance with the present invention, each equilibration circuit of a memory device is connected to the equilibration voltage through a transistor that is controlled by a pulsed signal. When the pulsed signal is high, the transistor will turn on, connecting the digit lines to the equilibration voltage to pre-charge the digit lines to the equilibration voltage. The pulse duration is short enough, however, to turn the transistor off before the equilibration voltage can be pulled down if a column to row short exists. By utilizing the pulsed signal to connect the equilibration circuit to the equilibration voltage, all column segments remain active, thereby allowing any segments with a defect to be replaced with segmented column repair.

These and other advantages and features of the invention will become more readily apparent from the following detailed description of the invention which is provided in connection with the accompanying drawings.

DETAILED DESCRIPTION OF THE PREFERRED EMBODIMENTS

Figure 5:
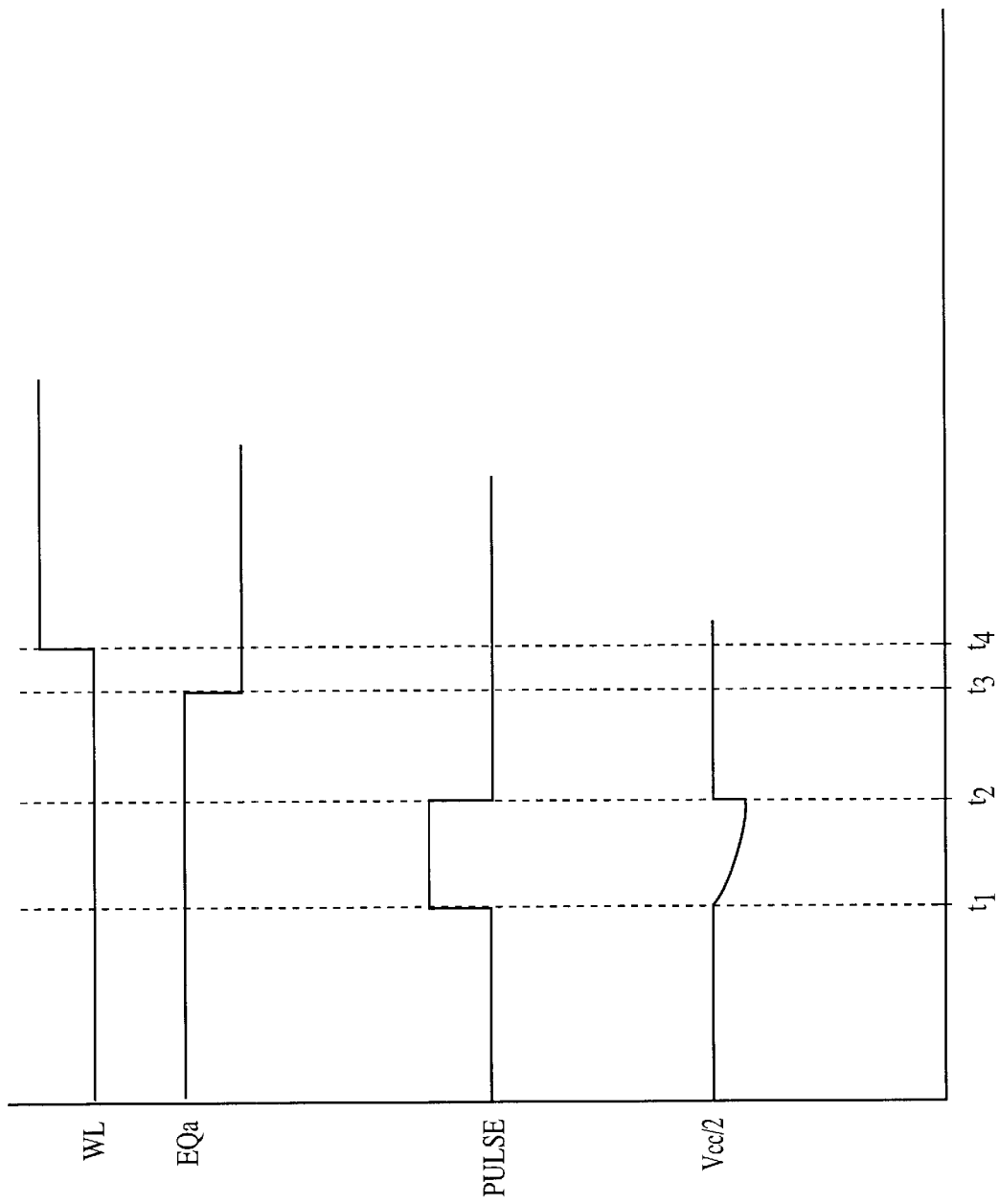
FIG. 5 illustrates a timing diagram of various signals of the equilibration circuit according to the present invention.
Figure 6:
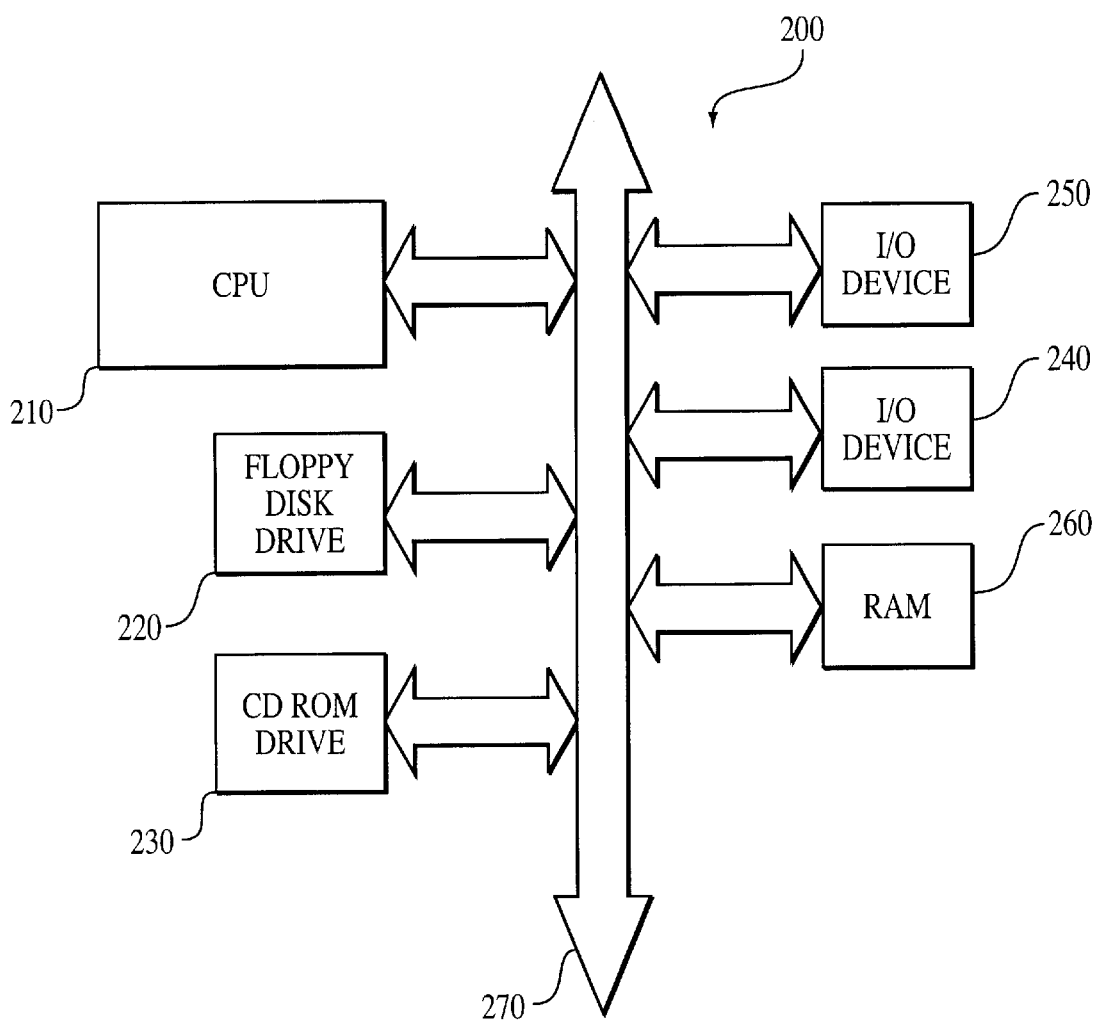
FIG. 6 illustrates in block diagram form a processor system that includes a memory circuit having an equilibration circuit according to the present invention.

The present invention will be described as set forth in the preferred embodiments illustrated in FIGS. 4–6. Other embodiments may be utilized and structural or logical changes may be made without departing from the spirit or scope of the present invention. Like items are referred to by like reference numerals.

In accordance with the present invention, an equilibration circuit for a memory device is provided that limits excessive current from being drawn by the memory device when a row to column short exists while still allowing the use of segmented column repair to maximize die area.

Figure 1:
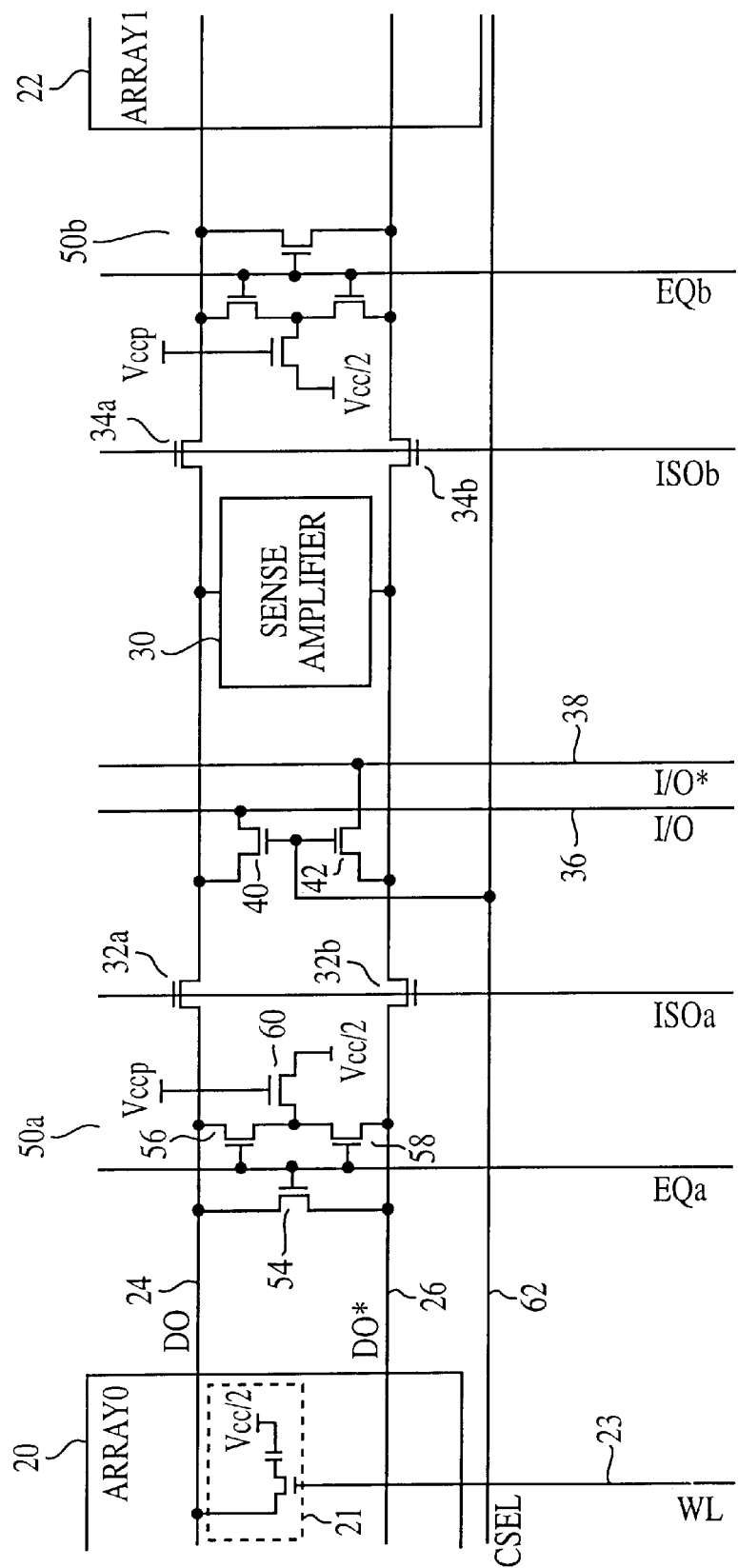
FIG. 1 illustrates a portion of a known memory device.
Figure 4:
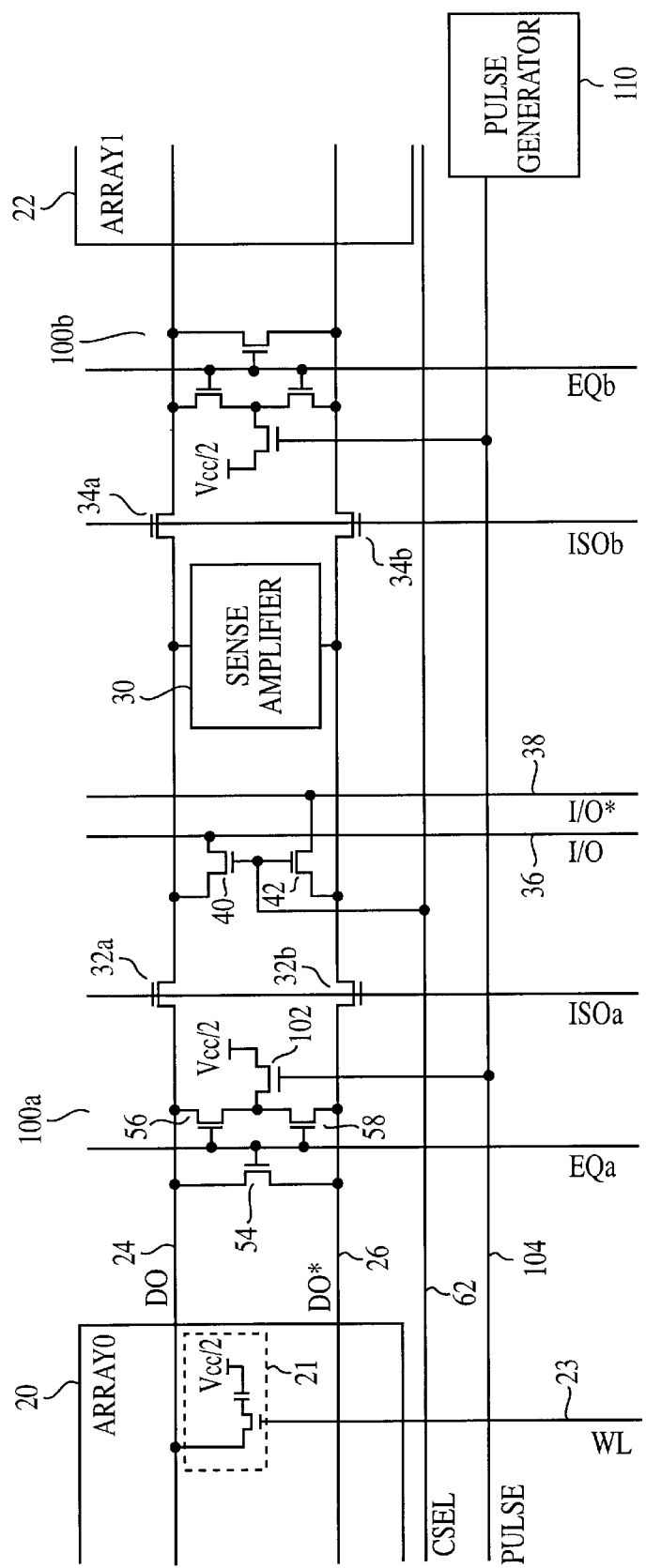
FIG. 4 illustrates a portion of a memory device having an equilibration circuit according to the present invention.

FIG. 4 illustrates a sense amplifier 30 and related circuitry of a portion of a DRAM device having equilibration circuits 100a and 100b according to the present invention. A first array ARRAY0 20 and a second array ARRAY1 22 each contains a plurality of memory cells 21 (illustrated in ARRAY0 20). While only one memory cell 21 is depicted, it should be understood that each array ARRAY0 20 and ARRAY1 22 contains a plurality of such cells. A sense amplifier 30 senses the voltage level in the selected memory cell of the selected array 20, 22 via the pair of digit lines D0 24 and D0* 26. One of the arrays 20, 22 is selected by the application of signals ISOa and ISOb to transistors 32a, 32b and 34a, 34b, respectively, as described with respect to FIG. 1.

When sense amplifier 30 has sensed the differential voltage across the digit lines D0 24 and D0* 26, a signal representing the charge stored in the accessed memory cell is output from the DRAM device on the input/output (I/O) lines I/O 36 and I/O* 38 by connecting the I/O lines I/O 36 and I/O* 38 to the sense amplifier 30. A column select (CSEL) signal from signal line 62 is applied to transistors 40, 42 to turn them on and connect the gut nodes of the sense amplifier 30 to the I/O lines I/O 36 and /O* 38.

In accordance with the present invention, equilibration circuits 100a and 100b are provided to equilibrate the digit lines D0 24 and D0* 26. Equilibration circuits 100a and 100b prevent excessive current from being drawn by the memory device, and a resulting drop in the equilibration voltage, when a row to column short exists while still allowing the use of segmented column repair to maximize die area as described below.

Equilibration circuit 100a includes a transistor 54 with a first source/drain region coupled to digit line D0 24, a second source/drain region coupled to digit line D0* 26 and a gate coupled to receive an equilibration signal labeled EQa. Equilibration circuit 100a further includes transistors 56, 58 and 102. Transistor 56 includes a first source/drain region that is coupled to digit line D0 24, a gate that is coupled to receive the equilibration signal EQa, and a second source/drain region that is coupled to a first source/drain region of transistor 102. Transistor 58 includes a first source/drain region that is coupled to digit line D0* 26, a gate that is coupled to receive the equilibration signal EQa, and a second source/drain region that is coupled to the first source/drain region of transistor 102. Transistor 102 has a second source/drain region that is coupled to an equilibration voltage, typically Vcc/2, and a gate that is connected to a PULSE signal line 104. The PULSE signal line 104 preferably runs parallel to the column select (CSEL) signal line 62. Equilibration circuit 100b is constructed in a similar manner to equilibration circuit 100a and operates in the same manner as circuit 100a, described below.

The operation of the equilibration circuit 100a will be described with respect to the timing diagram illustrated in FIG. 5. Suppose for example an access of memory cell 21 in ARRAY0 20 is to be performed. Equilibration circuit 100a effectively shorts digit line D0 24 to digit line D0* 26 such that both lines are equilibrated to the voltage Vcc/2 as follows. As noted above, when memory cell 21 is not being accessed, the signal EQa remains a high signal, turning on transistors 54, 56 and 58. This will short together the digit lines D0 24 and D0* 26. To equilibrate each of the digit lines D0 24 and D0* 26 to Vcc/2, it is necessary to connect each digit line to Vcc/2. At time $t_1$, a PULSE signal is applied to the gate of transistor 102, thereby turning on transistor 102 and connecting the digit lines D0 24 and D0* 26 to Vcc/2 through transistors 56, 58. The PULSE signal can be generated by a pulse generator 110. A single pulse generator 110 may be provided to provide the PULSE signal for all columns in the memory device. Alternatively, a separate pulse generator 110 may be provided for each column of a memory device, or a plurality of pulse generators may be provided with each pulse generator 110 providing the PULSE signal to a plurality of columns in the memory device. Pulse generator 110 may be provided on the same substrate as the memory device or may be on a different chip. Alternatively, the PULSE signal may be generated and provided to the memory device by a processor (not shown) that is connected to the memory device.

The PULSE signal lasts until time $t_2$, at which point transistor 102 turns off again, thereby disconnecting the digit lines D0 24 and D0* 26 from the potential Vcc/2. At time $t_3$, the signal EQa transitions from high to low, turning off transistors 54, 56 and 58 and isolating digit line D0 24 from D0* 26. Each digit line D0 24 and D0* 26 is now pre-charged to Vcc/2. At time $t_4$, the signal WL transitions from low to high, thereby turning on the transistor in memory cell 21 and allowing access to the bit capacitor of memory cell 21.

Figure 2:
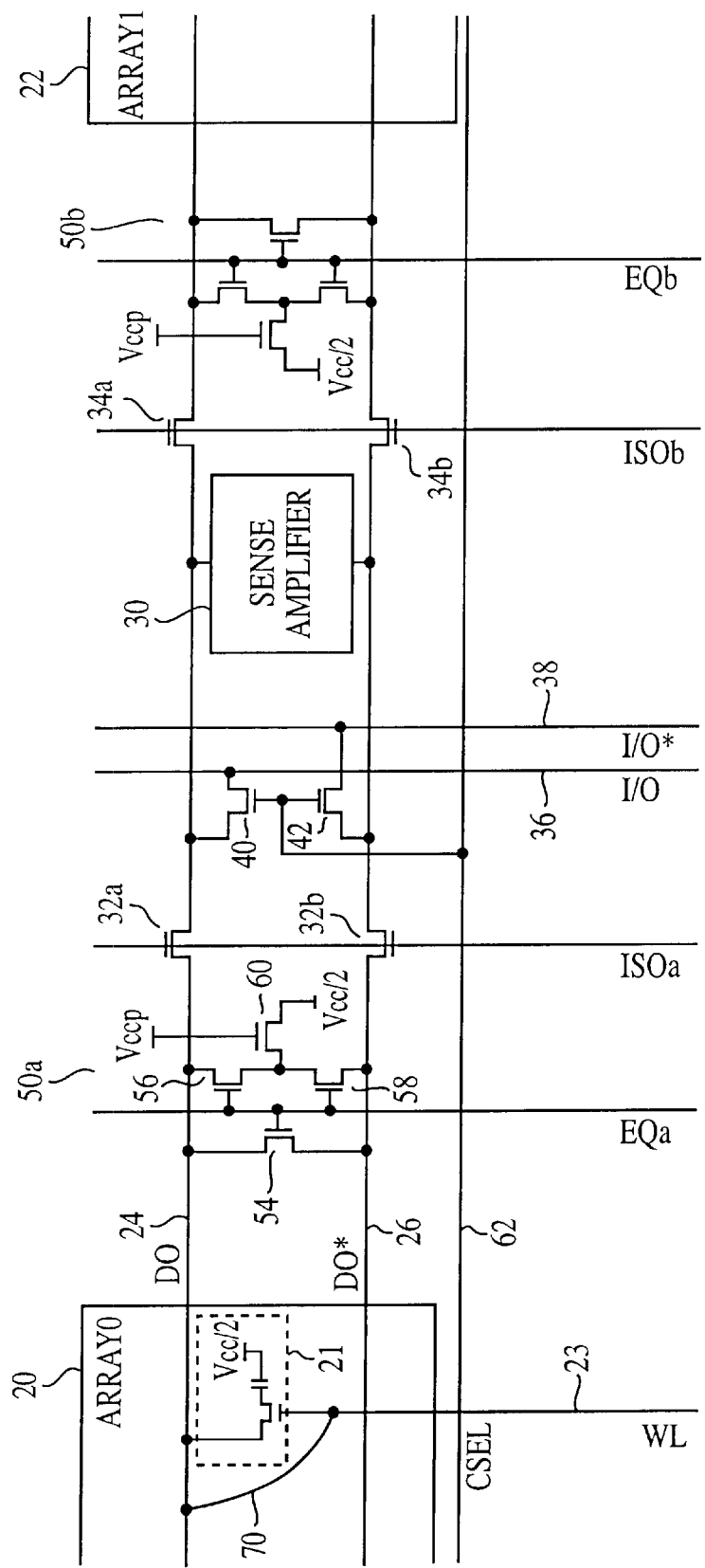
FIG. 2 illustrates a portion of a conventional memory device having a row to column short.

The application of the PULSE signal to transistor 102 according to the present invention limits the decrease in Vcc/2 from excessive current being drawn by a row to column short (short 70 as illustrated in FIG. 2) as follows. As shown in FIG. 5 and described above, the duration of the PULSE signal, and thus the turning on of transistor 102, is finite in length. The duration of the PULSE signal is determined based on a number of variables. For example, the relative size of transistor 102, i.e., resistance of transistor 102, and the capacitance of the digit lines D0 24 and D0* 26 will determine the necessary duration of the PULSE signal to ensure proper operation of equilibration circuit 100a, i.e., pre-charging of the digit lines D0 24 and D0*26 to Vcc/2. If transistor 102 is a high current device, i.e., a non-current limiting device in which the current that can pass is limited to some pre-determined amount, the duration of the PULSE signal can be very small. The duration of the PULSE signal must be of sufficient length to ensure that transistor 102 is on for a period of time to allow the digit lines D0 24 and D0* 26 to pre-charge to the full value of Vcc/2. The duration of the PULSE signal, however, must be short enough such that if a row to column short exists, transistor 102 will be turned off before the equilibration voltage Vcc/2 is decreased to a point where it will adversely affect the operation of the memory device.

For example, assume a row to column short circuit exists in the memory device, such as short 70 illustrated in FIG. 2. As shown in FIG. 5, at time $t_1$ when the PULSE signal goes high and transistor 102 is turned on, a conductive path will be created by the row to column short between wordline WL 23 (held at ground) and Vcc/2 through transistors 102 and 56. This conductive path allows excessive current to flow from Vcc/2 to ground, thereby causing the level of Vcc/2 to decrease. At time $t_2$, when the PULSE signal transitions from high to low, transistor 102 is turned off, thereby removing the conductive path between Vcc/2 and ground and halting the flow of current from Vcc/2 to ground via the conductive path. Once the conductive path is removed, Vcc/2 will return to its full value.

Figure 3:
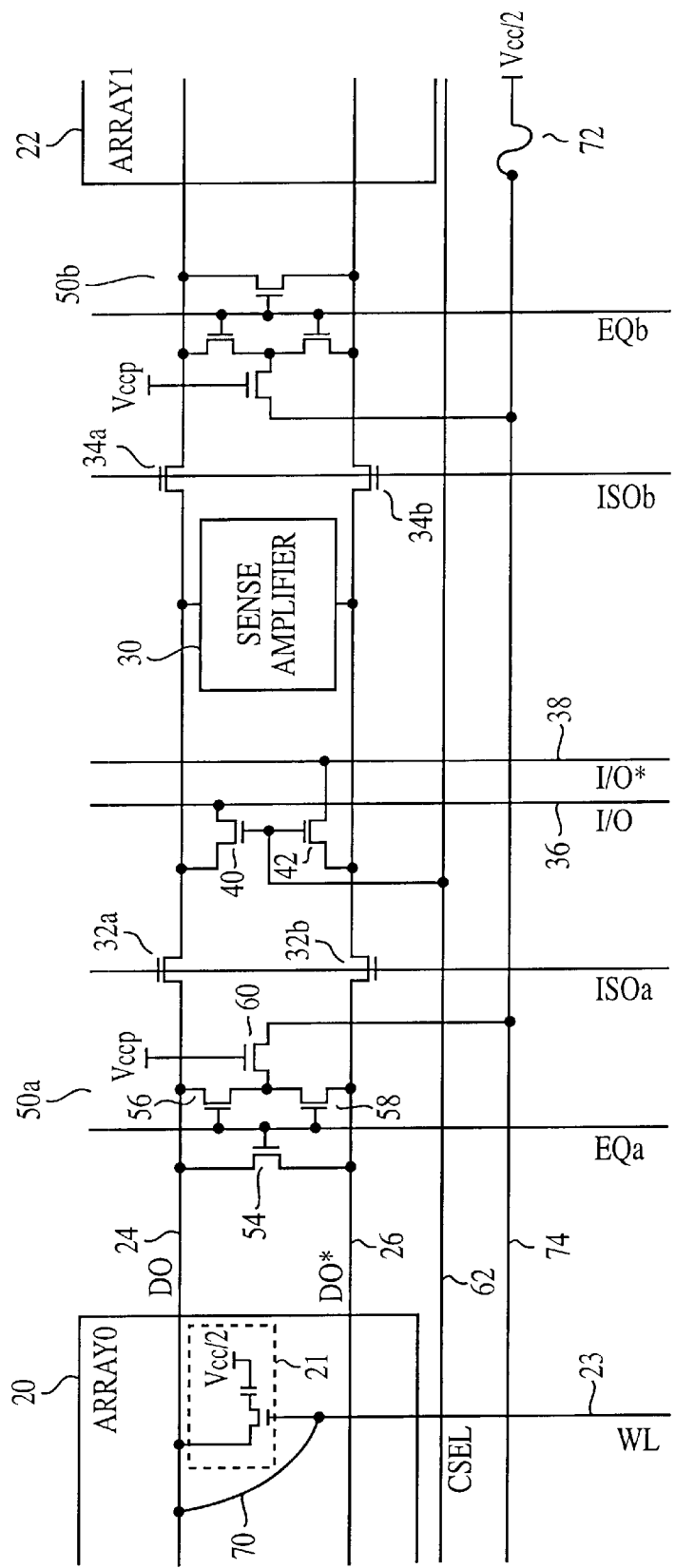
FIG. 3 illustrates a portion of another known memory device having a row to column short.

Thus, in accordance with the present invention, equilibration circuit 100a limits excessive current from being drawn by the memory device, and the resulting drop in the equilibration voltage Vcc/2. Additionally, the use of equilibration circuit 100a and the PULSE signal allows the memory device to utilize segmented column repair. For example, if a row to column short exists in one segment of a column, the equilibration circuit 100a does not require the disabling of all segments in that column, including those that are not defective, by disabling Vcc/2 to every segment as in the prior art circuit such as illustrated in FIG. 3. Instead, the use of the PULSE signal with equilibration circuit 100a limits the drop in Vcc/2 caused by the row to column short as described above with respect to FIGS. 4 and 5.

Additionally, if a separate pulse generator 110 is provided for each column, only those columns in which a row to column short exists would need to be pulsed. For example, the columns in which a short exists could be identified during manufacturer testing of the memory device. Only those columns in which shorts exist will have the PULSE signal applied as described with respect to FIG. 5. Those columns in which shorts do not exist can have the PULSE signal high at all times, thus saving the power required to generate and provide the PULSE signal to those columns that do not have shorts.

A typical processor based system that includes memory circuits having the equilibration circuit 100a according to the present invention is illustrated generally at 200 in FIG.

6. A computer system is exemplary of a system having memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 210, for example, a microprocessor, that communicates with one or more input/output (I/O) devices 240,250 over a bus 270. The computer system 200 also includes random access memory (RAM) 260, and, in the case of a computer system may include peripheral devices such as a floppy disk drive 220 and a compact disk (CD) ROM drive 230 which also communicate with CPU 210 over the bus 270. RAM 260 is preferably constructed as an integrated circuit that includes an equilibration circuit 100a as previously described with respect to FIG. 4. It may also be desirable to integrate the processor 210 and memory 260 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. An equilibration circuit for a memory device comprising:
   a first transistor having a first terminal adapted to be connected to a first digit line of said memory device, a gate terminal adapted to receive a first control signal, and a second terminal;
   a second transistor having a first terminal connected to said second terminal of said first transistor, a gate terminal adapted to receive said first control signal, and a second terminal adapted to be connected to a second digit line of said memory device;
   a third transistor having a first terminal connected to said first terminal of said second transistor, a second terminal adapted to be connected to a voltage potential, and a gate terminal adapted to receive a second control signal; and
   a pulse generator to generate said second control signal, wherein said second control signal is a pulsed signal having a predetermined duration, and said third transistor in response to said pulsed signal turns on for said predetermined duration and then turns off, to connect said first terminal of said second transistor and said second terminal of said first transistor to said voltage potential.

2. The equilibration circuit according to claim 1, further comprising:
   a fourth transistor having a first terminal adapted to be connected to said first digit line, a second terminal adapted to be connected to said second digit line, and a gate terminal adapted to receive said first control signal.

3. The equilibration circuit according to claim 2, wherein said first control signal is an equilibrate signal.

4. The equilibration circuit according to claim 1, wherein said pulse generator is provided on a same chip as said memory device.

5. The equilibration circuit according to claim 1, wherein said pulse generator is on a different chip than said memory device.

6. The equilibration circuit according to claim 1, wherein said voltage potential is Vcc/2.

7. The equilibration circuit according to claim 1, wherein said third transistor is a non-current limiting device.

8. The equilibration circuit according to claim 1, wherein said pulse generator supplies said second control signal to said gate terminal of said third transistor while said first control signal is being received by said gate terminals of said first and second transistors.

9. A circuit for pre-charging a first and second digit line of a memory device to a voltage potential comprising:
   a switch having a first terminal connect able to said first and second digit lines and a second terminal connected to said voltage potential,
   wherein said switch is turned on for a predetermined duration and then turned off, said switch when turned on connecting said voltage potential to said first and second digit lines and pre-charging said first and second digit lines to said voltage potential.

10. The circuit according to claim 9, wherein said switch is a first transistor having a first terminal connectable to said first and second digit lines, a second terminal connected to said voltage potential, and a gate terminal connected to receive a first control signal.

11. The circuit according to claim 10, further comprising:
   a second transistor having a first terminal connected to said first digit line of said memory device, a gate terminal adapted to receive a second control signal, and a second terminal connected to said first terminal of said first transistor;
   a third transistor having a first terminal connected to said first terminal of said first transistor, a gate terminal adapted to receive said second control signal, and a second terminal connected to said second digit line of said memory device.

12. The circuit according to claim 11, wherein said first control signal is applied to said gate terminal of said first transistor while said second control signal is being received by said gate terminals of said second and third transistors.

13. The circuit according to claim 10, wherein said first control signal is a pulsed signal.

14. The circuit according to claim 13, further comprising:
   a pulse generator to generate said pulsed signal.

15. The circuit according to claim 14, wherein said pulse generator and said circuit are on a same chip.

16. The circuit according to claim 10, wherein said first transistor is a non-current limiting device.

17. A memory device comprising:
   a plurality of memory arrays, each of said plurality of memory arrays having a plurality of memory cells arranged in rows and columns;
   a plurality of pairs of digit lines, each of said plurality of pairs of digit lines associated with a column of said plurality of memory cells; and
   a plurality of equilibration circuits, each of said plurality of equilibration circuits being associated with at least one pair of said plurality of pairs of digit lines, each of said plurality of equilibration circuits comprising:
      a first transistor having a first terminal connectable to a first digit line of one of said pairs of digit lines and a second digit line of said one of said pairs of said digit lines, a second terminal connected to a voltage potential, and a gate terminal connected to a control signal line to receive a first control signal; and a pulse generator connected to said control signal line, said pulse generator generating said first control signal, wherein said first control signal is a pulsed signal having a predetermined duration, and said first transistor in response to said pulsed signal turns on for a predetermined duration and then turns off again, said first transistor when turned on connecting said first and second digit lines of said one of said pairs of digit lines to said voltage potential to pre-charge said first and second digit lines to said voltage potential.

18. The memory device according to claim 17, wherein said equilibration circuit further comprises:

a second transistor having a first terminal connected to said first digit line of said one of said pairs of digit lines, a gate terminal connected to receive a second control signal, and a second terminal connected to said first terminal of said first transistor;

a third transistor having a first terminal connected to said first terminal of said first transistor, a gate terminal connected to receive said second control signal, and a second terminal connected to said second digit line of said one of said pairs of digit lines; and a fourth transistor having a first terminal connected to said first digit line of said one of said pairs of digit lines, a second terminal connected to said second digit line of said one of said pairs of digit lines, and a gate terminal connected to receive said second control signal.

19. The memory device according to claim 18, wherein said second control signal is an equilibrate signal.

20. The memory device according to claim 18, wherein said first control signal is received by said gate terminal of said first transistor while said second control signal is being received by said gate terminals of said second, third and fourth transistors.

21. The memory device according to claim 17, wherein said pulse generator supplies said pulse signal to a plurality of equilibration circuits of said memory device.

22. The memory device according to claim 21, wherein said pulse generator supplies said pulse signal to said plurality of equilibration circuits simultaneously.

23. The memory device according to claim 17, wherein said pulse generator is on a same chip as said memory device.

24. The memory device according to claim 17, wherein said pulse generator is in a processor connected to said memory device.

25. The memory device according to claim 17, further comprising:

a plurality of pulse generators, each of said plurality of pulse generators being associated with at least one of said plurality of equilibration circuits.

26. The memory device according to claim 25, wherein said plurality of pulse generators are provided on a same chip as said memory device.

27. The memory device according to claim 25, wherein at least one of said plurality of pulse generators is in a processor connected to said memory device.

28. The memory device according to claim 17, wherein said control signal line runs parallel to a column select line of said memory device.

29. The memory device according to claim 17, wherein said voltage potential is Vcc/2.

30. The memory device according to claim 17, wherein said first transistor is a non-current limiting device.

31. A processing system comprising:

a processing unit; and a memory device connected to said processing unit, said memory device comprising:

a plurality of memory arrays, each of said plurality of memory arrays having a plurality of memory cells arranged in rows and columns;

a plurality of pairs of digit lines, each of said plurality of pairs of digit lines associated with a column of said plurality of memory cells; and a plurality of equilibration circuits, each of said plurality of equilibration circuits being associated with at least one pair of said plurality of digit lines, each of said plurality of equilibration circuits comprising:

a first transistor having a first terminal connectable to a first digit line of one of said pairs of digit lines and a second digit line of said one of said pairs of said digit lines, a second terminal connected to a voltage potential, and a gate terminal connected to a control signal line to receive a first control signal; and a pulse generator connected to said control signal line, said pulse generator generating said first control signal, wherein said first control signal is a pulsed signal having a predetermined duration, and said first transistor in response to said pulsed signal turns on for a predetermined duration and then turns off again, said first transistor when turned on connecting said first and second digit lines of said one of said pairs of digit lines to said voltage potential to pre-charge said first and second digit lines to said voltage potential.

32. The processing system according to claim 31, wherein said equilibration circuit further comprises:

a second transistor having a first terminal connected to said first digit line of said one of said pairs of digit lines, a gate terminal connected to receive a second control signal, and a second terminal connected to said first terminal of said first transistor;

a third transistor having a first terminal connected to said first terminal of said first transistor, a gate terminal connected to receive said second control signal, and a second terminal connected to said second digit line of said one of said pairs of digit lines; and a fourth transistor having a first terminal connected to said first digit line of said one of said pairs of digit lines, a second terminal connected to said second digit line of said one of said pairs of digit lines, and a gate terminal connected to receive said second control signal.

33. The processing system according to claim 32, wherein said second control signal is an equilibrate signal.

34. The processing system according to claim 32, wherein said first control signal is received by said gate terminal of said first transistor while said second control signal is being received by said gate terminals of said second, third and fourth transistors.

35. The processing system according to claim 31, wherein said pulse generator supplies said pulse signal to a plurality of equilibration circuits of said memory device.

36. The processing system according to claim 35, wherein said pulse generator supplies said pulse signal to said plurality of equilibration circuits simultaneously.

37. The processing system according to claim 31, wherein said pulse generator is on a same chip as said memory device.

38. The processing system according to claim 31, wherein said pulse generator is in said processing unit connected to said memory device.

39. The processing system according to claim 31, further comprising:
a plurality of pulse generators, each of said plurality of pulse generators being associated with at least one of said plurality of equilibration circuits.

40. The processing system according to claim 39, wherein said plurality of pulse generators are provided on a same chip as said memory device.

41. The processing system according to claim 39, wherein at least one of said plurality of pulse generators is in said processing unit connected to said memory device.

42. The processing system according to claim 31, wherein said control signal line runs parallel to a column select line of said memory device.

43. The processing system according to claim 31, wherein said voltage potential is Vcc/2.

44. The processing system according to claim 31, wherein said first transistor is a non-current limiting device.

45. The processor system according to claim 31, wherein said processing unit and said memory device are on a same chip.

46. A method for charging a plurality of digit lines of a memory device to a voltage potential comprising:
supplying a pulsed control signal to turn on a switch having a first terminal connectable to said plurality of digit lines and a second terminal connected to said voltage potential to connect said plurality of digit lines to said voltage potential for a predetermined period of time;
charging said plurality of digit lines to said voltage potential; and
turning off said switch to disconnect said digit lines from said voltage potential after said predetermined period of time.

47. The method according to claim 46, wherein said switch is a first transistor, and said step of supplying a pulsed control signal further comprises:
supplying said pulsed control signal to a gate terminal of said transistor, said transistor having a first terminal connected to said voltage potential and a second terminal connectable to said digit lines, said transistor in response to said pulsed control signal turning on to connect said voltage potential to said digit lines.

48. The method according to claim 47, wherein before said step of supplying said pulsed control signal said method further comprises:
supplying a second control signal to a gate terminal of a second transistor, said second transistor having a first terminal connected to said second terminal of said first transistor and a second terminal connected to a first of said plurality of digit lines;
supplying said second control signal to a gate terminal of a third transistor, said third transistor having a first terminal connected to said second terminal of said first transistor and a second terminal connected to a second of said plurality of digit lines,
said second and third transistors in response to said second control signal turning on to connect said second terminal of said first transistor to said first and second of said plurality of digit lines.

49. The method according to claim 48, wherein said pulsed control signal is supplied to said gate terminal of said first transistor while said second control signal is being supplied to said gate terminal of said second and third transistors.

50. The method according to claim 48, further comprising:
supplying said second control signal to a gate terminal of a fourth transistor, said fourth transistor having a first terminal connected to said first of said plurality of digit lines and a second terminal connected to said second of said plurality of digit lines, said fourth transistor in response to said second control signal turning on to connect said first of said plurality of digit lines to said second of said plurality of digit lines.

51. The method according to claim 46, wherein said pulse signal is generated by a pulse generator.

52. The method according to claim 46, wherein the step of supplying a pulsed control signal further comprises:
supplying said pulsed control signal to a plurality of switches, each of said plurality of switches connecting a plurality of digit lines to said voltage potential.

53. The method according to claim 46, wherein said step of supplying a pulsed control signal further comprises:
supplying said pulsed control signal from a pulse generator on a same chip as said memory device.

54. The method according to claim 46, wherein said step of supplying a pulsed control signal further comprises:
supplying said pulsed control signal from a processing unit connected to said memory device.

55. The method according to claim 46, wherein said voltage potential is Vcc/2.

* * * * *

UNITED STATES PATENT AND TRADEMARK OFFICE
CERTIFICATE OF CORRECTION

| | |
|---|---|
| PATENT NO. | : 6,333,882 B1 |
| DATED | : December 25, 2001 |
| INVENTOR(S) | : Todd A. Merritt et al. |

It is certified that error appears in the above-identified patent and that said Letters Patent is hereby corrected as shown below:

<u>Column 8,</u>
Line 18, reads "connect able", should read -- connectable --.

Signed and Sealed this

Nineteenth Day of March, 2002

Attest:

JAMES E. ROGAN
*Director of the United States Patent and Trademark Office*

*Attesting Officer*